United States Patent
He et al.

(10) Patent No.: US 11,064,636 B2
(45) Date of Patent: Jul. 13, 2021

(54) EMI SHIELDS INCLUDING ELECTRICALLY-CONDUCTIVE FOAM

(71) Applicant: Laird Technologies, Inc., Chesterfield, MO (US)

(72) Inventors: Yongxue He, Dublin, CA (US); Waleed Alam, Stockton, CA (US)

(73) Assignee: Laird Technologies, Inc., Chesterfield, MO (US)

( * ) Notice: Subject to any disclaimer, the term of this patent is extended or adjusted under 35 U.S.C. 154(b) by 0 days.

(21) Appl. No.: 16/586,101

(22) Filed: Sep. 27, 2019

(65) Prior Publication Data

US 2021/0100140 A1    Apr. 1, 2021

(51) Int. Cl.
| | |
|---|---|
| *H04B 10/00* | (2013.01) |
| *H05K 9/00* | (2006.01) |
| *H04B 10/40* | (2013.01) |
| *G02B 6/42* | (2006.01) |

(52) U.S. Cl.
CPC ......... *H05K 9/0058* (2013.01); *G02B 6/4277* (2013.01); *H04B 10/40* (2013.01); *H05K 9/0015* (2013.01); *H05K 9/0084* (2013.01); *H05K 9/0088* (2013.01)

(58) Field of Classification Search
CPC .... H04B 10/40; H05K 9/0058; H05K 9/0015; H05K 9/0052; G02B 6/4277; G02B 6/4256; G02B 6/4292; G02B 6/4246
USPC ....... 398/135, 136, 137, 138, 139, 158, 159, 398/164; 385/88, 89, 90, 92, 93, 94; 361/816, 818, 799, 789, 752; 439/607, 439/607.01, 607.2, 607.21
See application file for complete search history.

(56) References Cited

U.S. PATENT DOCUMENTS

| | | | |
|---|---|---|---|
| 6,817,782 B2 | 11/2004 | Togami et al. | |
| 7,060,348 B2 | 6/2006 | Creasy et al. | |
| 7,458,733 B2 | 12/2008 | Anderl et al. | |
| 7,928,324 B2* | 4/2011 | Moore ................. | H05K 9/0058 174/354 |
| 8,622,770 B2* | 1/2014 | Teo ...................... | H05K 9/0058 439/607.2 |

(Continued)

OTHER PUBLICATIONS

CF-500 Series EcoFoam™ Conductive Foam, www.lairdtech.com, Copyright 2015, 2 pages.

*Primary Examiner* — Hanh Phan
(74) *Attorney, Agent, or Firm* — Harness, Dickey & Pierce, P.L.C.; Anthony G. Fussner

(57) ABSTRACT

Exemplary embodiments are disclosed of EMI shields including electrically-conductive foam (broadly, electrically-conductive resiliently compressible porous material). An exemplary embodiment includes an electromagnetic interference (EMI) shield for an optical transceiver including transmitter and receiver optical sub-assemblies. The EMI shield includes a portion having openings configured for receiving the transmitter and receiver optical sub-assemblies therethrough to thereby allow the EMI shield to be fit over the transmitter and receiver optical sub-assemblies for installation along a portion of the optical transceiver. The EMI shield also includes sidewalls depending from the portion that includes the openings. Electrically-conductive resiliently compressible porous material (e.g., electrically-conductive foam, etc.) is along at least a portion of an outer perimeter defined by the sidewalls.

18 Claims, 5 Drawing Sheets

(56) References Cited

U.S. PATENT DOCUMENTS

| | | | |
|---|---|---|---|
| 8,967,884 B2 * | 3/2015 | Kondou | G02B 6/4245 |
| | | | 385/92 |
| 9,357,683 B2 | 5/2016 | Liu et al. | |
| 9,918,416 B2 | 3/2018 | Mao et al. | |
| 2010/0098427 A1 | 4/2010 | Ice et al. | |
| 2010/0266246 A1 | 10/2010 | van Haaster | |
| 2014/0199904 A1 | 7/2014 | Creasy, Jr. et al. | |
| 2017/0160502 A1 | 6/2017 | Zhao et al. | |
| 2019/0098804 A1 * | 3/2019 | Wang | H04B 10/40 |

* cited by examiner

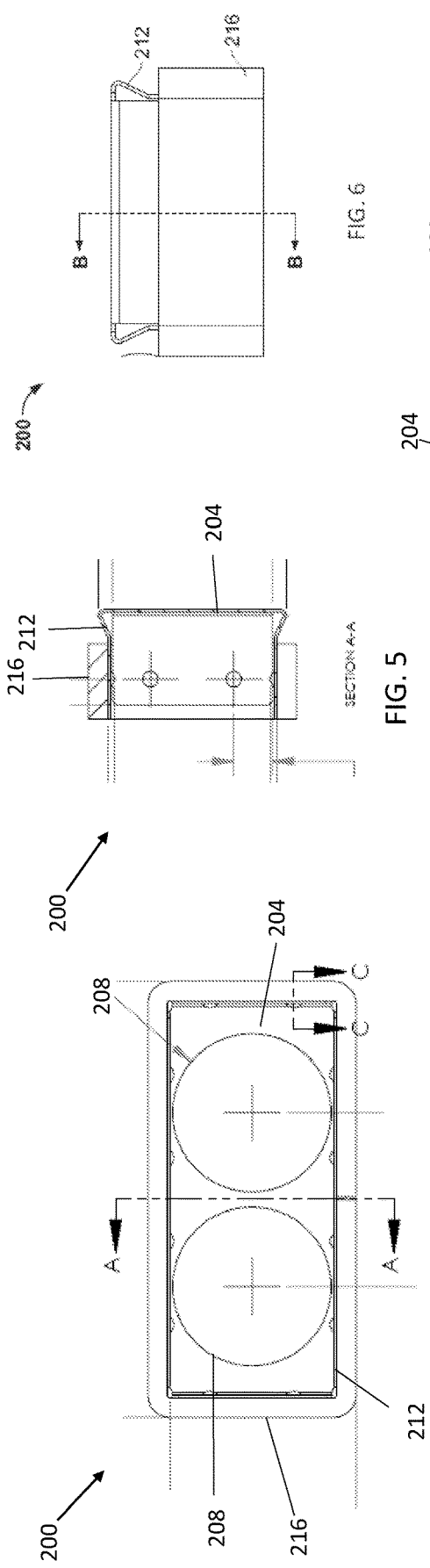
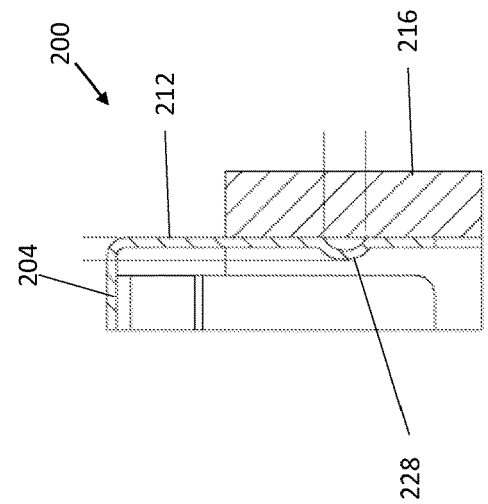
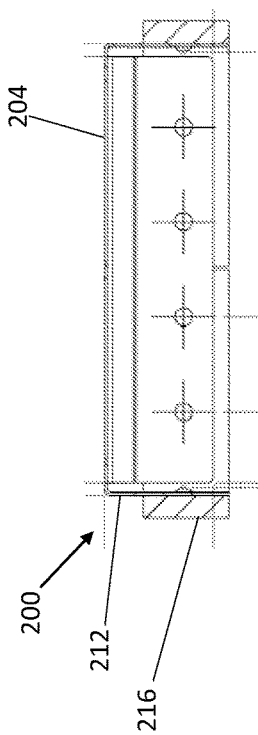
FIG. 4
FIG. 5
FIG. 6
FIG. 7
FIG. 8

EMI SHIELDS INCLUDING ELECTRICALLY-CONDUCTIVE FOAM

FIELD

The present disclosure generally relates to EMI shields including electrically-conductive foam.

BACKGROUND

This section provides background information related to the present disclosure which is not necessarily prior art.

A common problem in the operation of electronic devices is the generation of electromagnetic radiation within the electronic circuitry of the equipment. Such radiation may result in electromagnetic interference (EMI) or radio frequency interference (RFI), which can interfere with the operation of other electronic devices within a certain proximity. Without adequate shielding, EMI/RFI interference may cause degradation or complete loss of important signals, thereby rendering the electronic equipment inefficient or inoperable.

A common solution to ameliorate the effects of EMI/RFI is through the use of shields capable of absorbing and/or reflecting and/or redirecting EMI energy. These shields are typically employed to localize EMI/RFI within its source, and to insulate other devices proximal to the EMI/RFI source. For example, board level shields are widely used to protect sensitive electronic devices against inter and intra system electromagnetic interferences and reduce unwanted electromagnetic radiations from a noisy integrated circuit (IC).

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) broadly includes and refers to mitigating, suppressing, or limiting EMI and/or RFI, such as by absorbing, reflecting, blocking, and/or redirecting the energy or some combination thereof so that it no longer interferes, for example, for government compliance and/or for internal functionality of the electronic component system.

DRAWINGS

The drawings described herein are for illustrative purposes only of selected embodiments and not all possible implementations, and are not intended to limit the scope of the present disclosure.

FIG. 4 is a bottom plan view of the EMI shield shown in FIG. 3, and illustrating inwardly extending dimples along the sidewalls.

FIG. 5 is a cross-sectional view of the EMI shield taking along the plane A-A shown in FIG. 4.

FIG. 6 is an end view of the EMI shield shown in FIG. 3.

FIG. 7 is a cross-sectional view of the EMI shielding taking along the plane B-B shown in FIG. 6.

FIG. 8 is a cross-sectional view of the EMI shield taking along the plane C-C shown in FIG. 4.

FIG. 9 also illustrates a portion of an exemplary optical transceiver including transmitter and receiver optical sub-assemblies (TOSA and ROSA).

Corresponding reference numerals indicate corresponding (though not necessarily identical) parts throughout the several views of the drawings.

DETAILED DESCRIPTION

Figure 2:
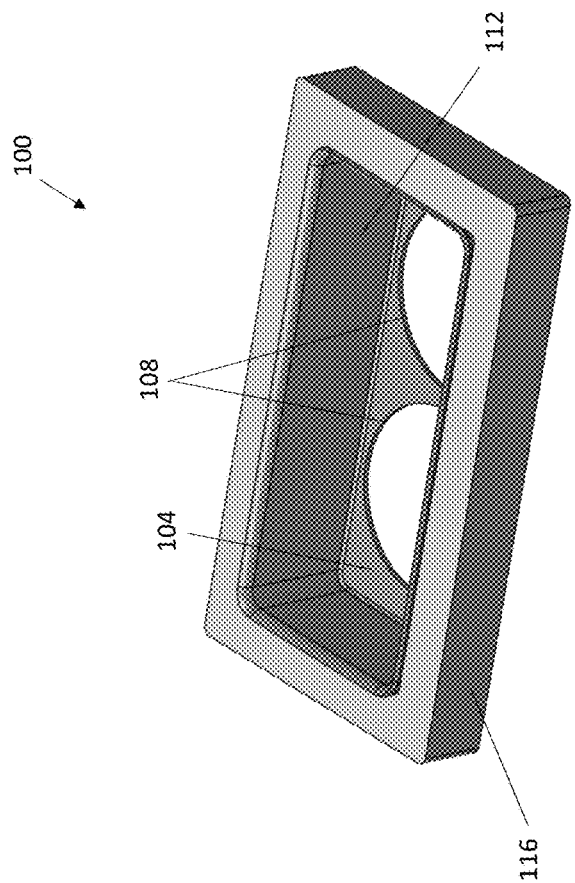
FIGS. 1 and 2 are perspective views of an exemplary embodiment of an EMI shield including sidewalls and electrically-conductive foam disposed along an outer perimeter defined by the sidewalls.

Example embodiments will now be described more fully with reference to the accompanying drawings.

Optical transceivers include transmitter and receiver optical sub-assemblies (TOSA and ROSA), which respectively include components that enable data transmission and reception over fiber optic cables. But as recognized herein, the TOSA/ROSA areas in optical transceivers have EMI noise issues, which must be addressed and alleviated. Conventional solutions for addressing/alleviating EMI noise issues associated with the TOSA/ROSA areas include using EMI gaskets for improved electrical grounding or radio frequency (RF) absorbers.

Optical transceiver technology has moved forward from 10 G/40 G to 100 G/400 G, which has increased the EMI noise frequency from 10-12 GHz to 25-30 GHz. The EMI noise frequency will continue to increase as more/faster data transfer is required, e.g., from 100 G/400 G to 800 G transceivers and so forth. For high end optical transceivers, metal housings may be used for the TOSA/ROSA. And, plastic housings may be used for the TOSA/ROSA for low end optical transceivers. But as recognized herein, EMI leakage may be problematic for both the metal housings and the plastic housings. With metal housings, EMI noise may leak out from the gap between the metal TOSA/ROSA to the module shell and/or in between the TOSA and ROSA. With plastic housings, the EMI noise leakage may be even be worse as EMI noise may leak directly out through the two TOSA/ROSA holes in the plastic housing.

A conventional EMI shielding gasket or collar for an optical transceiver may be made by stamping and folding a piece of stainless steel. The gasket's stamped/folded sidewalls are spaced apart or separated by gaps along the corners defined between adjacent pairs of the gasket's stamped/folded sidewalls. The conventional EMI shielding gasket also includes resilient spring fingers that are spaced part and separated by gaps between each pair of adjacent fingers. The resilient spring fingers may be configured for mounting and providing electrical grounding contact for the gasket. The conventional gasket's numerous gaps, however, may allow too much EMI leakage such that the gasket is unable to provide adequate EMI shielding when installed via the resilient spring fingers around a portion of an optical transceiver. When the conventional EMI shielding gasket is disposed generally between a cage and the optical transceiver, the gasket is unable to provide adequate shielding of EMI passing through the interface between the cage and the optical transceiver 5 as the gaps are too large to effectively shield high frequency noise, such as 25 GHz to 30 GHz noise or above.

After recognizing the above, exemplary embodiments of EMI shields including electrically-conductive foam (broadly, electrically-conductive resiliently compressible porous materials) were developed and disclosed herein. Exemplary embodiments of EMI shields are disclosed herein that are configured to be suitable for use with optical transceivers (broadly, devices) and provide adequate EMI shielding (e.g., up to 60 GHz or more, etc.) for TOSA/ROSA areas (broadly, device portions) without any significant and/or appreciable EMI leakage.

In exemplary embodiments, an EMI shield includes a portion defining openings configured for receiving the TOSA and ROSA of an optical transceiver to thereby allow the EMI shield to be fit over the TOSA and ROSA (e.g. TOSA/ROSA 333 shown in FIG. 10, etc.) and installed onto the optical transceiver. The EMI shield includes sidewalls depending downwardly from the portion that includes the TOSA/ROSA openings. By way of example, the sidewalls may comprise fully drawn sidewalls (e.g., sidewalls 112 shown in FIGS. 1 and 2, etc.) such that there are not any gaps along the corners between adjacent pairs of sidewalls. Or, for example, the sidewalls may comprise stamped and folded sidewalls (e.g., sidewalls 212 shown in FIG. 3, etc.) such that there are gaps along the corners between adjacent pairs of sidewalls. An electrically-conductive foam is disposed (e.g., wrapped at least partially or entirely, etc.) around an outer perimeter defined by the sidewalls.

For example, an elongate strip or piece of electrically-conductive foam may be wrapped around an outer perimeter defined by the sidewalls. In this example, the piece of electrically-conductive foam may be wrapped entirely around the outer perimeter defined by the sidewalls such that the opposite free end portions of the piece of electrically-conductive foam contact or abut against each other to thereby define a seam (e.g., seam 220 in FIG. 3, etc.). The seam may be centered relative to the sidewall along which the seam is positioned. The seam may be centered between the first and second holes that are configured for fitting over TOSA and ROSA. The electrically-conductive foam may be adhesively attached (e.g., electrically-conductive pressure sensitive adhesive (PSA), etc.) to the sidewalls of the EMI shield.

The electrically-conductive foam may be configured (e.g., due to its thickness, compressibility, and resilience, etc.) to help the EMI shield establish, maintain, and/or improve electrical grounding contact between the EMI shield and an adjacent electrically-conductive surface of the housing that will contact the electrically-conductive foam when the optical transceiver (or other device) is positioned within (e.g., slidably inserted into, etc.) the module's shell or cage (broadly, housing).

The electrically-conductive foam may be configured to help the EMI shield establish, improve, and/or maintain good electrical grounding contact between the EMI shield's sidewalls and an adjacent electrically-conductive surface of the optical transceiver (or other device). For example, the EMI shield's sidewalls may include inwardly protruding portions (e.g., full dimples 228 in FIGS. 3 and 8, half dimples, etc.) that are configured for making electrical grounding contact with the adjacent electrically-conductive surface of the optical transceiver. When the optical transceiver is positioned with the housing, the electrically-conductive foam may be compressed between the housing and the optical transceiver from an initial uncompressed foam thickness (e.g., 0.70 millimeters, etc.) to a lower compressed foam thickness. The resilient nature of the electrically-conductive foam urges the compressed foam to rebound, recover, expand, or return towards its initial uncompressed state. But the electrically-conductive foam may be unable to fully decompress because of its positioning between the housing and the optical transceiver. This may create, apply, or transfer a force to the sidewalls that compresses, urges, or biases the sidewalls inwardly towards each other, which may help to establish, improve, and/or maintain good electrical grounding contact between the inwardly protruding portions along the inner surfaces of the sidewalls and the adjacent electrically-conductive surface of the optical transceiver. The electrically-conductive foam may allow for the elimination of resilient spring fingers and the gaps therebetween that are conventionally used with EMI shielding gaskets or collars.

The electrically-conductive foam may be configured to effectively seal (e.g., corner gaps of an EMI shield, etc.) against EMI leakage due to the foam's compressibility, resilience, and/or ability to fill up void space. For example, the electrically-conductive foam may be wrapped around the sidewalls of the EMI shield over corner gaps between adjacent pairs of the EMI shield's sidewalls. The electrically-conductive foam may sealingly cover the corner gaps and inhibit EMI leakage through the corner gaps.

Figure 1:
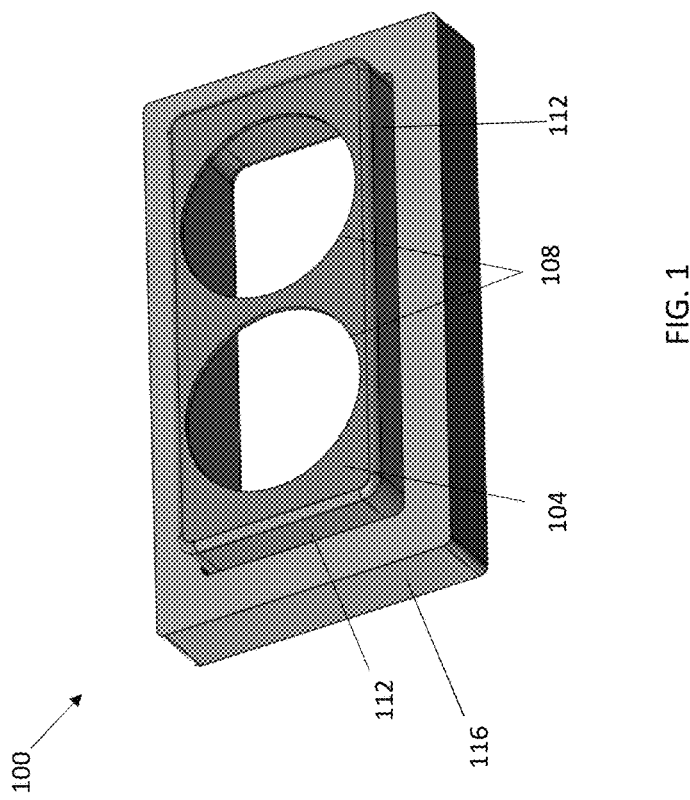

FIGS. 1 and 2 illustrate an EMI shield 100 suitable for use with an optical transceiver (broadly, a device) according to an exemplary embodiment embodying one or more aspects of the present disclosure. As shown, the EMI shield 100 includes a top or upper portion 104 (broadly, a portion) defining holes 108 (broadly, openings) that are configured (e.g., sized, circularly shaped, located, etc.) for receiving the transmitter and receiver optical sub-assemblies (TOSA and ROSA) (broadly, device portions) of an optical transceiver. The holes 108 allow the EMI shield 100 to be fit over the TOSA and ROSA and installed onto the optical transceiver.

The EMI shield 100 includes sidewalls 112 depending downwardly from the top portion 104. In this exemplary embodiment, the sidewalls 112 are fully drawn such that there are not any gaps along the corners between adjacent pairs of the sidewalls 112. The EMI shield 112 also does not include any resilient spring fingers or gaps along the bottom of the sidewalls 112. Instead, the sidewalls 112 define a continuous unbroken bottom edge along the entire perimeter as shown in FIG. 2. Accordingly, this exemplary embodiment with the fully drawn sidewalls 112 does not have any additional openings other than the two holes 108 for the TOSA and ROSA, which thereby allows for improved shielding effectiveness.

Each sidewall 112 is generally perpendicular to the top portion 104 in this exemplary embodiment. Also, this exemplary embodiment includes four sidewalls 112 defining a generally rectangular outer perimeter for the EMI shield 100. The four sidewalls 112 also define a generally rectangular inner perimeter configured to generally correspond in shape and size with a rectangular mounting surface or portion of the optical transceiver along which the EMI shield 100 will be installed. Alternative embodiments may include more or less than four sidewalls, one or more sidewalls that are non-perpendicular (e.g., at an acute angle relative to, etc.) to the top portion, and/or sidewalls defining non-rectangular inner and/or outer perimeters for the EMI shield.

Electrically-conductive foam 116 (broadly, an electrically-conductive resiliently compressible porous material) is disposed (e.g., entirely, at least partially, etc.) along an outer perimeter defined by the sidewalls 112. The electrically-conductive foam 116 may be attached to the sidewalls 112, e.g., via an electrically-conductive pressure sensitive adhesive (PSA), other suitable adhesives, other attachment means, etc.

In this exemplary embodiment, the electrically-conductive foam 116 may comprise a single continuous annular piece of electrically-conductive foam having an opening (e.g., cut, punched, formed, etc.). The opening may be configured (e.g., sized, shaped, etc.) to frictionally receive (e.g., friction fit over, etc.) at least the lower portion of the sidewalls 112. As shown in FIG. 2, the electrically-conductive foam 116 defines a continuous unbroken bottom edge along the entire perimeter (e.g., rectangular perimeter, etc.) of the electrically-conductive foam 116. Alternatively, the electrically-conductive foam 116 may comprise two or more pieces of the electrically-conductive foam that are in contact with each other such that the two or more pieces define or provide the electrically-conductive foam around the entire perimeter of the sidewalls 112 such that there are no gaps large enough through which EMI may escape.

As yet another example, the electrically-conductive foam 116 may comprise a single continuous piece of electrically-conductive foam 116 that is wrapped around the outer perimeter defined by the sidewalls 112. In this latter example, the piece of electrically-conductive foam 116 may be wrapped entirely around the outer perimeter defined by the sidewalls 112 such that the opposite free end portions of the piece of electrically-conductive foam 116 contact or abut against each other to thereby define a seam. The seam may be centered relative to the sidewall 112 along which the seam is positioned and/or centered between the two holes 108.

The electrically-conductive foam 116 may be operable as an EMI sleeve, gasket, or collar along the perimeter of the EMI shield's sidewalls 112. The electrically-conductive foam 116 may be configured to effectively seal gaps between the EMI shield's sidewalls 112 and the optical module shell, cage, or housing. The electrically-conductive foam 116 may be configured to be sufficiently soft, compressible, and/or resilient for filling the spaces in the corners of the optical module shell's inner surface. The electrically-conductive foam 116 may be configured to be sufficiently soft, compressible, and/or resilient to fill gaps with a relatively large tolerance. The electrically-conductive foam 116 may be configured to be sufficiently electrically conductive to allow the EMI shield 100 to provide good EMI shielding, e.g., up to 60 GHz or more, etc.

The EMI shield's sidewalls 112 and top/upper portion 104 may be formed from a single piece of electrically-conductive material so that the sidewalls 112 and top portion 104 have an integral monolithic construction. A wide range of electrically-conductive materials may be used, such as stainless steels (e.g., 301/302 stainless steel, etc.), phosphor bronze, copper-clad steel, brass, monel, nickel silver alloys, aluminum, aluminum alloys, steels, carbon steel, cold rolled steel, sheet metal, brass, copper, copper nickel alloys, beryllium copper alloys, other copper based alloys, alloys of magnesium, among others.

In this exemplary embodiment, a flat profile pattern for the EMI shield's sidewalls 112 and the top portion 104 including the holes 108 may be stamped into a piece of electrically-conductive material (e.g., stainless steel, etc.). Then, the sidewalls 112 may be fully drawn such that the sidewalls 112 are continuous without any gaps along the sidewalls 112. In this exemplary embodiment, there are no gaps along the corners between adjacent pairs of sidewalls 112. And, the sidewalls 112 define a single continuous, unbroken perimeter having a closed shape. Alternatively, the EMI shield's sidewalls and top portion may be formed differently, e.g., by stamping and then folding the sidewalls, etc.

FIGS. 3 through 8 illustrate an EMI shield 200 suitable for use with an optical transceiver (broadly, a device) according to another exemplary embodiment embodying one or more aspects of the present disclosure. As shown, the EMI shield 200 includes a top or upper portion 204 (broadly, a portion) defining holes 208 (broadly, openings) that are configured (e.g., sized, circularly shaped, located, etc.) for receiving the transmitter and receiver optical sub-assemblies (TOSA and ROSA) (broadly, device portions) of an optical transceiver. The holes 208 allow the EMI shield 200 to be fit over the TOSA and ROSA and installed onto the optical transceiver.

The EMI shield 200 includes sidewalls 212 depending downwardly from the top portion 204. In this exemplary embodiment, the sidewalls 212 are stamped and folded such that there are gaps 224 along the corners between adjacent pairs of the sidewalls 212. The EMI shield 212 does not include any resilient spring fingers along the bottom of the sidewalls 212. Instead, the sidewalls 212 define a continuous unbroken bottom edge along the entire perimeter.

In this exemplary embodiment, the opposite shorter walls 212 are generally perpendicular to the top portion 204. But the opposite longer walls 212 have inwardly bent, slanted, or angled upper portions that are not perpendicular with the top portion 204 as show in FIGS. 3, 5, and 6. The upper portions of the opposite longer walls 212 may extend or slant inwardly towards each other such that at an acute angle (e.g., about 66 degrees, 65 degrees, 64 degrees, etc.) is defined between the inner surface of the top portion 204 and the inner surface of the upper portion of each longer sidewall 212.

Figure 3:
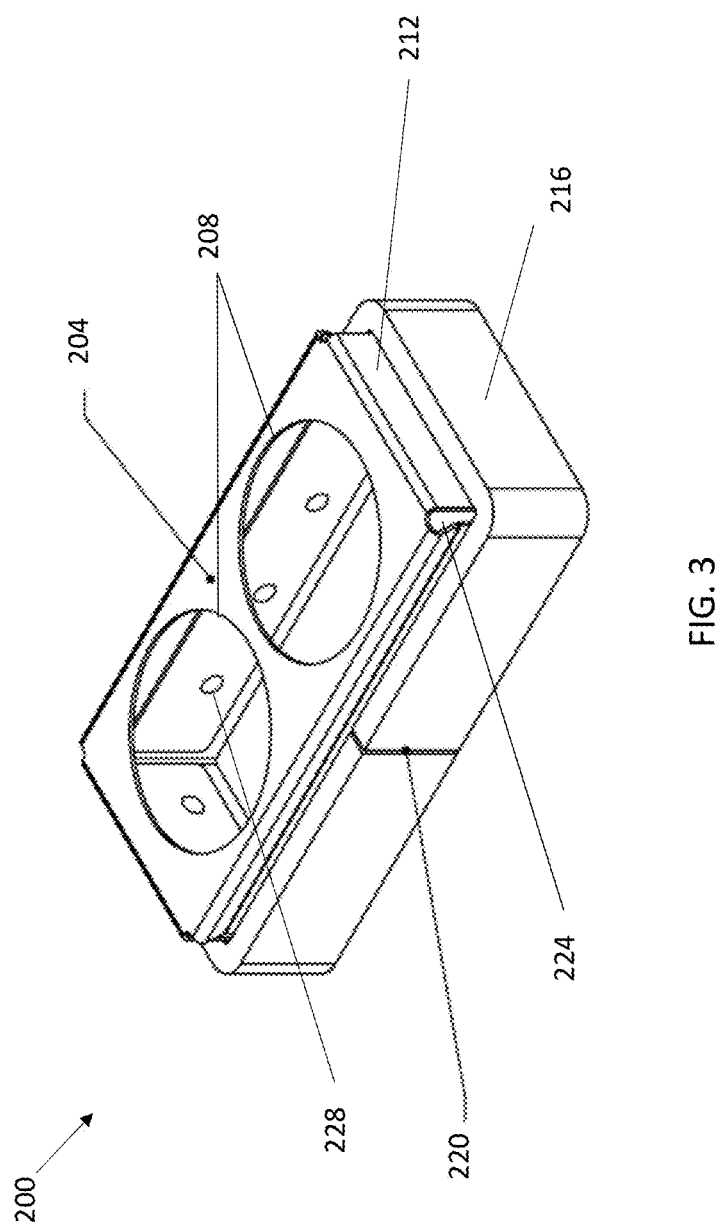
FIG. 3 is a perspective view of another exemplary embodiment of an EMI shield including sidewalls and electrically-conductive foam disposed along an outer perimeter defined by the sidewalls.

Also, this exemplary embodiment includes four sidewalls 212 defining a generally rectangular outer perimeter for the EMI shield 200 as shown in FIGS. 3 and 4. The four sidewalls 212 also define a generally rectangular inner perimeter configured to generally correspond in shape and size with a rectangular mounting surface or portion of the optical transceiver along which the EMI shield 200 will be installed. Alternative embodiments may include more or less than four sidewalls, one or more sidewalls that are non-perpendicular (e.g., at an acute angle relative to, etc.) to the top portion, and/or sidewalls defining non-rectangular inner and/or outer perimeters for the EMI shield.

Electrically-conductive foam 216 (broadly, an electrically-conductive resiliently compressible porous material) is disposed (e.g., entirely, at least partially, etc.) along an outer perimeter defined by the sidewalls 212. The electrically-conductive foam 216 may be attached to the sidewalls 212, e.g., via an electrically-conductive pressure sensitive adhesive (PSA), other suitable adhesives, other attachment means, etc.

In this exemplary embodiment, the electrically-conductive foam 216 comprises a single continuous piece of electrically-conductive foam 216 that is wrapped around the outer perimeter defined by the sidewalls 212. The piece of electrically-conductive foam 216 is wrapped entirely around the outer perimeter defined by the sidewalls 212 such that the opposite free end portions of the piece of electrically-conductive foam 216 contact or abut against each other to thereby define a seam 220 (FIG. 3). The seam 220 may be centered relative to the sidewall 212 along which it is positioned and/or centered between the two holes 208.

Alternatively, the electrically-conductive foam 216 may comprise a single continuous annular piece of electrically-conductive foam having an opening (e.g., cut, punched, formed, etc.). The opening may be configured (e.g., sized, shaped, etc.) to frictionally receive (e.g., friction fit over, etc.) the lower portion of the sidewalls 212. As another example, the electrically-conductive foam 216 may comprise two or more pieces of the electrically-conductive foam in contact with each other such that the two or more pieces define or provide the electrically-conductive foam around the entire perimeter of the sidewalls 212 such that there are no gaps large enough through which EMI may escape.

The electrically-conductive foam 216 may be operable as an EMI sleeve, gasket, or collar along the perimeter of the EMI shield's sidewalls 212. The electrically-conductive foam 216 may be configured to effectively seal gaps between the EMI shield's sidewalls 212 and the optical module shell, cage, or housing. The electrically-conductive foam 216 may be configured to be sufficiently soft, compressible, and/or resilient for filling the spaces in the corners of the optical module shell's inner surface. The electrically-conductive foam 216 may be configured to be sufficiently soft, compressible, and/or resilient to fill gaps with a relatively large tolerance. The electrically-conductive foam 216 may be configured to be sufficiently electrically conductive to allow the EMI shield 200 to provide good EMI shielding, e.g., up to 60 GHz or more, etc.

The electrically-conductive foam 216 may be configured to help the EMI shield 200 establish, maintain, and improve good electrical grounding contact between the EMI shield's sidewalls and an adjacent electrically-conductive surface of the optical transceiver (or other device). As shown in FIGS. 3, 4, and 8, the EMI shield 200 includes dimples 228 (broadly, inwardly protruding portions or protrusions) along the sidewalls 212. The dimples 228 are configured (e.g., extend inwardly from the sidewalls 212, etc.) for making electrical grounding contact with the adjacent electrically-conductive surface of the optical transceiver. When the optical transceiver is positioned with the housing, the electrically-conductive foam 216 may be compressed between the housing and the optical transceiver from an initial uncompressed foam thickness (e.g., 0.70 millimeters, etc.) to a lower compressed foam thickness. The resilient nature of the electrically-conductive foam 216 urges the compressed foam to rebound, recover, expand, or return towards its initial uncompressed state. But the electrically-conductive foam 216 may be unable to fully decompress because of its positioning between the housing and the optical transceiver. This may create, apply, or transfer a force to the sidewalls 212 that compresses, urges, or biases the sidewalls 212 inwardly towards each other, which may help to establish, improve, and/or maintain good electrical grounding contact between the dimples 228 along the inner surfaces of the sidewalls 212 and the adjacent electrically-conductive surface of the optical transceiver. The electrically-conductive foam 216 may also allow for the elimination of resilient spring fingers spaced apart by gaps that are conventionally used with EMI shielding gaskets or collars.

The EMI shield's sidewalls 212 and top/upper portion 204 may be formed from a single piece of electrically-conductive material so that the sidewalls 212 and top portion 204 have an integral monolithic construction. A wide range of electrically-conductive materials may be used, such as stainless steels (e.g., 301/302 stainless steel, etc.), phosphor bronze, copper-clad steel, brass, monel, nickel silver alloys, aluminum, aluminum alloys, steels, carbon steel, cold rolled steel, sheet metal, brass, copper, copper nickel alloys, beryllium copper alloys, other copper based alloys, alloys of magnesium, among others.

In this exemplary embodiment, a flat profile pattern for the EMI shield's sidewalls 212 and the top portion 204 including the holes 208 may be stamped into a piece of electrically-conductive material (e.g., stainless steel, etc.). Then, the sidewalls 212 may be folded relative to (e.g., downwardly from, etc.) the top portion 204. In this exemplary embodiment, gaps 224 are along the corners between adjacent pairs of sidewalls 212. The electrically-conductive foam 216 is disposed along or wrapped around the outer perimeter along the sidewalls 212 to thereby sealing cover at least portions of the gaps 224 to inhibit EMI leakage.

Figure 10:
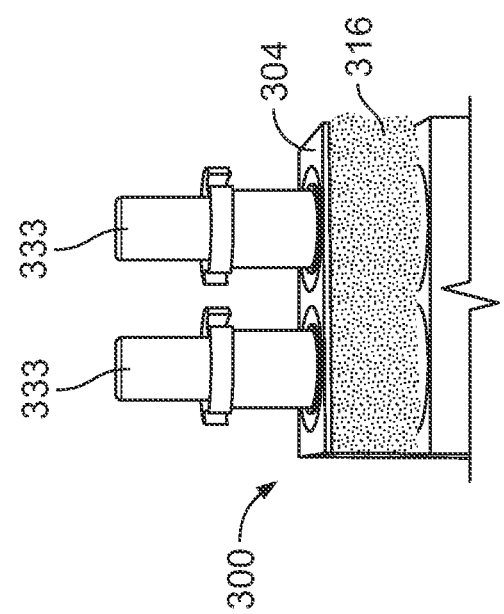
FIG. 10 illustrates the EMI shield installed on the optical transceiver shown in FIG. 9 after positioning the TOSA and ROSA through the holes in the EMI shield.
Figure 9:
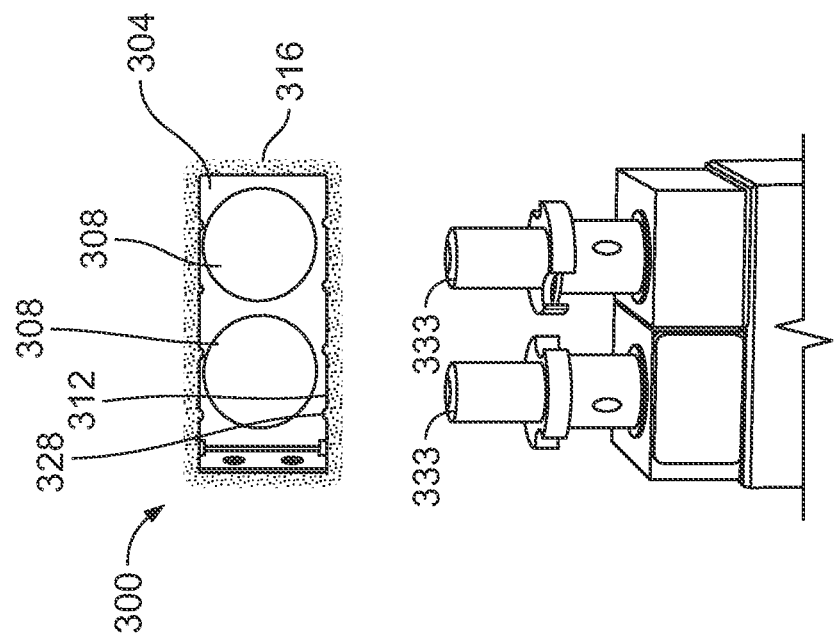
FIG. 9 illustrates an exemplary embodiment of an EMI shield including sidewalls and electrically-conductive foam disposed along an outer perimeter defined by the sidewalls.

FIGS. 9 and 10 illustrate an EMI shield 300 suitable for use with an optical transceiver (broadly, a device) according to another exemplary embodiment embodying one or more aspects of the present disclosure. As shown, the EMI shield 300 includes a top or upper portion 304 (broadly, a portion) defining holes 308 (broadly, openings) that are configured (e.g., sized, circularly shaped, located, etc.) for receiving the transmitter and receiver optical sub-assemblies 333 (TOSA and ROSA) (broadly, device portions) of an optical transceiver. The holes 308 allow the EMI shield 300 to be fit over the TOSA and ROSA 333 and installed onto the optical transceiver.

The EMI shield 300 includes sidewalls 312 depending downwardly from the top portion 304. Electrically-conductive foam 316 (broadly, an electrically-conductive resiliently compressible porous material) is disposed (e.g., entirely, at least partially, etc.) along an outer perimeter defined by the sidewalls 312. The electrically-conductive foam 316 may be attached to the sidewalls 312, e.g., via an electrically-conductive pressure sensitive adhesive (PSA), other suitable adhesives, other attachment means, etc.

The electrically-conductive foam 316 may be operable as an EMI sleeve, gasket, or collar along the perimeter of the EMI shield's sidewalls 312. The electrically-conductive foam 316 may be configured to effectively seal gaps between the EMI shield's sidewalls 312 and the optical module shell, cage, or housing. The electrically-conductive foam 316 may be configured to be sufficiently soft, compressible, and/or resilient for filling the spaces in the corners of the optical module shell's inner surface. The electrically-conductive foam 316 may be configured to be sufficiently soft, compressible, and/or resilient to fill gaps with a relatively large tolerance. The electrically-conductive foam 316 may be configured to be sufficiently electrically conductive to allow the EMI shield 300 to provide good EMI shielding, e.g., up to 60 GHz or more, etc.

The electrically-conductive foam 316 may be configured to help the EMI shield 300 establish, maintain, and improve good electrical grounding contact between the EMI shield's sidewalls and an adjacent electrically-conductive surface of the optical transceiver (or other device). As shown in FIG. 9, the EMI shield 300 includes dimples 328 (broadly, inwardly protruding portions or protrusions) along the sidewalls 312. The dimples 328 are configured (e.g., extend inwardly from the sidewalls 312, etc.) for making electrical grounding contact with the adjacent electrically-conductive surface of the optical transceiver. When the optical transceiver is positioned with the housing, the electrically-conductive foam 316 may be compressed between the housing and the optical transceiver from an initial uncompressed foam thickness (e.g., 0.70 millimeters, etc.) to a lower compressed foam thickness. The resilient nature of the electrically-conductive foam 316 urges the compressed foam to rebound, recover, expand, or return towards its initial uncompressed state. But the electrically-conductive foam 316 may be unable to fully decompress because of its positioning between the housing and the optical transceiver. This may create, apply, or transfer a force to the sidewalls 312 that compresses, urges, or biases the sidewalls 312 inwardly towards each other, which may help to establish, improve, and/or maintain good electrical grounding contact between the dimples 328 along the inner surfaces of the sidewalls 312 and the adjacent electrically-conductive surface of the optical transceiver. The electrically-conductive foam 316 may also allow for the elimination of resilient spring fingers spaced apart by gaps that are conventionally used with EMI shielding gaskets or collars.

The EMI shield's sidewalls 312 and top/upper portion 304 may be formed from a single piece of electrically-conductive material so that the sidewalls 312 and top portion 304 have an integral monolithic construction. A wide range of electrically-conductive materials may be used, such as stainless steels (e.g., 301/302 stainless steel, etc.), phosphor bronze, copper-clad steel, brass, monel, nickel silver alloys, aluminum, aluminum alloys, steels, carbon steel, cold rolled steel, sheet metal, brass, copper, copper nickel alloys, beryllium copper alloys, other copper based alloys, alloys of magnesium, among others.

Figure 11:
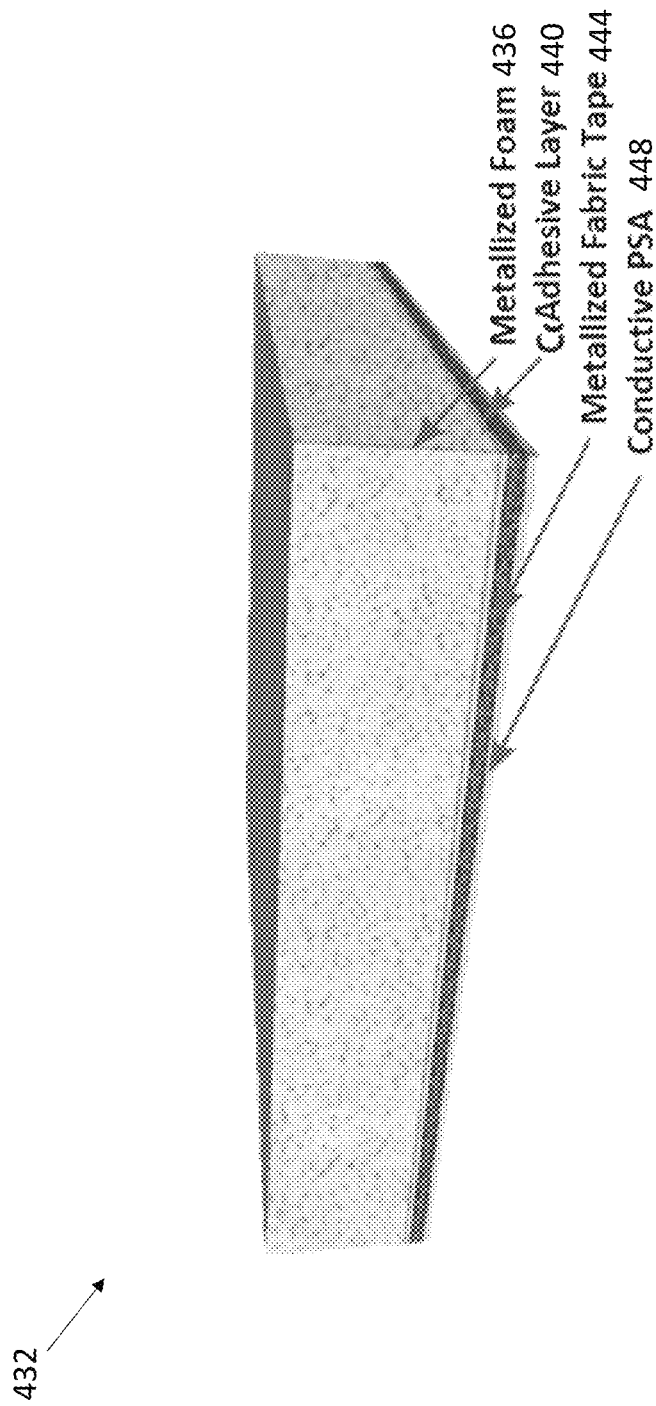
FIG. 11 illustrates an electrically-conductive foam material assembly that may be used in exemplary embodiments.

A wide range of electrically-conductive resiliently compressible porous materials may be used for or instead of the electrically-conductive foam (e.g., 116 (FIGS. 1-2), 216 (FIGS. 3-8), 316 (FIGS. 9-10), etc.) in exemplary embodiments. For example, the electrically-conductive foam 116, 216, 316, etc. may comprise an electrically-conductive foam material assembly 432 as shown in FIG. 11 and described below. By way of further example, the electrically-conductive foam may comprise a silicone foam material, a polymeric elastomer material, a cellular polymeric foam such as an open celled foam, a closed cell foam, a neoprene foam, a urethane foam (e.g., a polyester foam, a polyether foam, a combination thereof, etc.), a polyurethane foam, a silicone rubber material, etc.

In an exemplary embodiment, the electrically-conductive foam (e.g., 116 (FIGS. 1-2), 216 (FIGS. 3-8), 316 (FIGS. 12-13), etc.) comprises an electrically-conductive foam material assembly (e.g., stackup, etc.) having an electrically-conductive PSA along one side, an uncompressed initial height or thickness of 0.7 millimeters, excellent z-axis conductivity to provide effective EMI shielding and grounding, and low compression forces. In this exemplary embodiment, the electrically-conductive foam material assembly is RoHS compliant and halogen-free per IEC-61249-2-21 standard. Continuing with this example, the electrically-conductive foam material assembly has a Z-axis resistance of less than 0.2 (for a 25 mm×25 mm test sample, 1000 gf loading), shielding effectiveness of about 87 decibels (dB) at 300 megahertz (MHz), about 108 dB at 3 gigahertz (GHz), and about 78 dB at 18 GH, a compression set of less than 30% according to ASDTM D3574, a foam density of about 25 to about 35 kilograms/meter cubed ($kg/m^3$) (e.g., 25 $kg/m^3$, 30 $kg/m^3$, 35 $kg/m^3$, etc.), and operating temperature range from about −40 degrees Celsius to about 70 degrees Celsius.

FIG. 11 illustrates an electrically-conductive foam material assembly 432 assembly that may be used in exemplary embodiments for the electrically-conductive foam (e.g., 116 (FIGS. 1-2), 216 (FIGS. 3-8), 316 (FIGS. 9-10), etc.). As shown, the material stackup of the electrically-conductive foam material assembly 432 includes a metallized foam core 436 (e.g., polyurethane open cell foam plated with metal, etc.), an electrically-conductive adhesive layer 440 (e.g., an electrically-conductive PSA, polyamide hot melt adhesive web film, etc.), a metallized fabric tape 444 (e.g., metal plated mesh fabric, etc.), and an electrically-conductive PSA 448.

The metallized fabric tape 444 may comprise a metalized or metal plated mesh fabric, such as nickel and copper plated taffeta fabric, nickel and copper plated ripstop fabric, and/or a nickel metal plated fabric. In an exemplary embodiment, the metallized fabric tape 444 may comprise metallized fabric including nickel and copper plated fabric in which nickel is plated over a base layer of copper previously plated on the fabric. In use, the base layer of copper is highly electrically conductive copper while the outer layer of nickel provides corrosion resistance. Alternative embodiments may include different materials, such as different porous materials other than polyurethane open cell foam, different metallized fabrics other than mesh (e.g., woven, non-woven, knotted, or knitted fabrics, other materials having an open texture, etc.), different metal platings, and/or different adhesives.

Alternative embodiments may include other electrically-conductive foams or electrically-conductive resiliently compressible porous materials. For example, the electrically-conductive foam may comprise any one of the CF-500 Series ECOFOAM™ conductive foams from Laird Technologies. Or, for example, the electrically-conductive foam may comprise a material assembly as disclosed in U.S. Patent Application Publication US2014/0199904, which is incorporated herein by reference in its entirety.

In exemplary embodiments, electrically-conductive foam is attached to the sidewalls via an electrically-conductive adhesive. The adhesive may be a silicone-based electrically-conductive adhesive (e.g., a silicone pressure sensitive adhesive, etc.). The adhesive may be loaded with an effective amount of flame retardant (e.g., halogen-free flame retardant free of halogens, such as bromines and chlorines, etc.) to enable the EMI shield to achieve a UL-94 flame rating of V-0, while at the same time having good bond strength and retaining properties suitable (e.g., bulk resistivity, etc.) for the desired contact applications. In other embodiments, other adhesives may be used such as solvent based polyester adhesives, epoxy-based adhesives, hot melt adhesives, combinations thereof, etc. The adhesive may preferably have no more than a maximum of 900 parts per million chlorine, no more than a maximum of 900 parts per million bromine, and no more than a maximum of 1,500 parts per million total halogens such that the adhesive is halogen free.

In exemplary embodiments, the EMI shield may achieve a flame rating of V-0 under UL-94, may be RoHS compliant, and may be halogen free as defined by the IEC 61249-2-21 standard (have no more than a maximum of 900 parts per million chlorine, no more than a maximum of 900 parts per million bromine, and no more than a maximum of 1,500 parts per million total halogens). Exemplary embodiments may include flame retardant electrically-conductive resiliently compressible porous materials having internal interstices where the internal surfaces of the interstices are electrically conductive, and contain an effective amount of flame retardant. The flame retardant may be in the form of a particulate dispersed throughout the interstices of the electrically-conductive resiliently compressible porous material which particulate is adhered to the internal surfaces. In such embodiments, the particulate may preferably occupy less than a majority (e.g., no more than about 30%, no more than about 20%, no more than about 10%, etc.) of the total internal surface area defined by the interstices. Alternatively, the flame retardant may be in the form of a relatively thin coating on the internal surfaces of the interstices, which coating may have a thickness of about 12 microns or less, about 5 microns or less, about 2 microns or less, etc. In exemplary embodiments, the electrically-conductive resiliently compressible porous material may be substantially free of occluded interstices, e.g., less than a majority (e.g., less than 25 percent, less than 10 percent, etc.) of the interstices (or pores) of the porous material are occluded or blocked.

Also disclosed are exemplary methods relating to electromagnetic interference (EMI) shielding for optical transceivers (broadly, devices) including transmitter and receiver optical sub-assemblies. In an exemplary embodiment, a method includes providing electrically-conductive resiliently compressible porous material (e.g., electrically-conductive foam, etc.) along at least a portion of an outer perimeter defined by sidewalls of an EMI shield. The sidewalls depend from a portion of the EMI shield that includes openings. The openings are configured for receiving the transmitter and receiver optical sub-assemblies of an optical transceiver therethrough to thereby allow the EMI shield to be fit over the transmitter and receiver optical sub-assemblies for installation along a portion of the optical transceiver. The electrically-conductive resiliently compressible porous material is configured to establish an electrically-conductive pathway between the sidewalls and a housing when the optical transceiver and EMI shield are slidably positioned within the housing.

In an exemplary embodiment, a method includes positioning an EMI shield relative to the transmitter and receiver optical sub-assemblies of an optical transceiver such that the transmitter and receiver optical sub-assemblies extend through openings in a portion of the EMI shield and such that the EMI shield installed along a portion of the optical transceiver. The EMI shield further includes sidewalls depending from the portion that includes the openings. Electrically-conductive resiliently compressible porous material (e.g., electrically-conductive foam, etc.) is along at least a portion of an outer perimeter defined by the sidewalls.

The method may further include positioning the optical transceiver and the EMI shield within a housing such that the electrically-conductive resiliently compressible porous material is compressed between the sidewalls and the housing and establishes an electrically-conductive pathway between the sidewalls and the housing.

Exemplary embodiments are disclosed of EMI shields that are configured to be suitable for use with optical transceivers. But exemplary embodiments of the EMI shields disclosed herein may also be configured for use with other transceivers and other devices (e.g., small form-factor pluggable (SFP) transceivers, SFP+ transceivers, quad small form-factor pluggable (QSFP) transceiver, QSFP+ transceivers, XFP transceivers, etc.), etc. Accordingly, aspects of the present disclosure should not be limited to use with only optical transceivers.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. For example, when permissive phrases, such as "may comprise", "may include", and the like, are used herein, at least one shield comprises or includes the feature(s) in at least one exemplary embodiment. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An electromagnetic interference (EMI) shield for an optical transceiver including transmitter and receiver optical sub-assemblies, the EMI shield comprising:
    a portion including openings configured for receiving the transmitter and receiver optical sub-assemblies therethrough to thereby allow the EMI shield to be fit over the transmitter and receiver optical sub-assemblies for installation along a portion of the optical transceiver;
    sidewalls depending from the portion that includes the openings; and
    electrically-conductive resiliently compressible material along at least a portion of an outer perimeter defined by the sidewalls;
    wherein the electrically-conductive resiliently compressible material is compressible between the optical transceiver and a housing when the EMI shield is installed on the optical transceiver and slidably positioned within the housing, whereby compression and resilience of the electrically-conductive resiliently compressible material helps the EMI shield establish, improve, and/or maintain good electrical grounding contact between the sidewalls and an adjacent electrically-conductive surface of the optical transceiver and/or between the electrically-conductive resiliently compressible material and the housing.

2. An electromagnetic interference (EMI) shield for an optical transceiver including transmitter and receiver optical sub-assemblies, the EMI shield comprising:
    a portion including openings configured for receiving the transmitter and receiver optical sub-assemblies therethrough to thereby allow the EMI shield to be fit over the transmitter and receiver optical sub-assemblies for installation along a portion of the optical transceiver;
    sidewalls depending from the portion that includes the openings; and
    electrically-conductive resiliently compressible material along at least a portion of an outer perimeter defined by the sidewalls;
    wherein the electrically-conductive resiliently compressible material is compressible between the optical transceiver and a housing when the EMI shield is installed on the optical transceiver and slidably positioned within the housing, whereby compression and resilience of the electrically-conductive resiliently compressible material helps effectively seal gap(s) between the EMI shield and the housing against EMI leakage.

3. An electromagnetic interference (EMI) shield for an optical transceiver including transmitter and receiver optical sub-assemblies, the EMI shield comprising:
    a portion including openings configured for receiving the transmitter and receiver optical sub-assemblies therethrough to thereby allow the EMI shield to be fit over the transmitter and receiver optical sub-assemblies for installation along a portion of the optical transceiver;
    sidewalls depending from the portion that includes the openings; and
    electrically-conductive resiliently compressible material along at least a portion of an outer perimeter defined by the sidewalls;
    wherein the electrically-conductive resiliently compressible material comprises:
        a metallized foam core;
        a metallized fabric;
        an electrically-conductive adhesive between the metallized foam core and the metallized fabric; and
        an electrically-conductive pressure sensitive adhesive;
        the metallized fabric between the electrically-conductive adhesive and the electrically-conductive pressure sensitive adhesive.

4. The EMI shield of claim 3, wherein:
    the metallized foam core comprises polyurethane open cell foam plated with metal;
    the electrically-conductive adhesive comprises an electrically-conductive pressure sensitive adhesive or a polyamide hot melt adhesive web film; and
    the metallized fabric comprises a metal plated mesh fabric.

5. An electromagnetic interference (EMI) shield for an optical transceiver including transmitter and receiver optical sub-assemblies, the EMI shield comprising:
    a portion including openings configured for receiving the transmitter and receiver optical sub-assemblies therethrough to thereby allow the EMI shield to be fit over the transmitter and receiver optical sub-assemblies for installation along a portion of the optical transceiver;
sidewalls depending from the portion that includes the openings; and
electrically-conductive resiliently compressible material along at least a portion of an outer perimeter defined by the sidewalls;
wherein the electrically-conductive resiliently compressible material is a single continuous piece of the electrically-conductive resiliently compressible material that is wrapped entirely around the outer perimeter defined by the sidewalls such that free end portions of the single continuous piece of the electrically-conductive resiliently compressible material abut against each other and define a seam along a corresponding one of the sidewalls.

6. An electromagnetic interference (EMI) shield for an optical transceiver including transmitter and receiver optical sub-assemblies, the EMI shield comprising:
a portion including openings configured for receiving the transmitter and receiver optical sub-assemblies therethrough to thereby allow the EMI shield to be fit over the transmitter and receiver optical sub-assemblies for installation along a portion of the optical transceiver;
sidewalls depending from the portion that includes the openings; and
electrically-conductive resiliently compressible material along at least a portion of an outer perimeter defined by the sidewalls;
wherein the electrically-conductive resiliently compressible material is configured to establish an electrically-conductive pathway between the sidewalls and a housing when the EMI shield is installed on the optical transceiver and slidably positioned within the housing.

7. The EMI shield of claim 6, wherein the electrically-conductive resiliently compressible material is an annular piece of the electrically-conductive resiliently compressible material that defines an opening configured to receive at least a portion of the sidewalls therein.

8. The EMI shield of claim 7, wherein:
the electrically-conductive resiliently compressible material comprises electrically-conductive foam; and
the sidewalls and the portion from which the sidewalls depend comprise metal.

9. The EMI shield of claim 7, wherein:
the electrically-conductive resiliently compressible material comprises polyurethane open cell foam plated with metal; and
the sidewalls and the portion from which the sidewalls depend comprise stainless steel.

10. The EMI shield of claim 7, wherein the sidewalls comprise folded portions of a stamped sheet of metal such that gaps are defined along corners between adjacent pairs of the sidewall.

11. The EMI shield of claim 7, wherein the sidewalls comprise fully drawn portions of a stamped sheet of metal such that no gaps are defined along corners between adjacent pairs of the sidewalls.

12. The EMI shield of claim 7, wherein the EMI shield includes an electrically-conductive adhesive that adhesively attaches the electrically-conductive resiliently compressible material along outer surfaces of the sidewalls.

13. The EMI shield of claim 7, wherein the sidewalls define a single continuous unbroken bottom edge along an entire perimeter of the EMI shield.

14. An optical transceiver comprising transmitter and receiver optical sub-assemblies and the EMI shield of claim 7, wherein the EMI shield is installed along a portion of the optical transceiver such that the transmitter and receiver optical sub-assemblies extend through the openings of the EMI shield.

15. An electromagnetic interference (EMI) shield for an optical transceiver including transmitter and receiver optical sub-assemblies, the EMI shield comprising:
a portion including openings configured for receiving the transmitter and receiver optical sub-assemblies therethrough to thereby allow the EMI shield to be fit over the transmitter and receiver optical sub-assemblies for installation along a portion of the optical transceiver;
sidewalls depending from the portion that includes the openings; and
electrically-conductive resiliently compressible material along at least a portion of an outer perimeter defined by the sidewalls;
wherein the sidewalls do not include any resilient spring fingers spaced apart by gaps along the bottom edge of the sidewalls.

16. An optical transceiver comprising transmitter and receiver optical sub-assemblies and an electromagnetic interference (EMI) shield, the EMI shield comprising:
a portion including openings configured for receiving the transmitter and receiver optical sub-assemblies therethrough to thereby allow the EMI shield to be fit over the transmitter and receiver optical sub-assemblies for installation along a portion of the optical transceiver;
sidewalls depending from the portion that includes the openings; and
electrically-conductive resiliently compressible material along at least a portion of an outer perimeter defined by the sidewalls;
wherein the EMI shield is installed along a portion of the optical transceiver such that the transmitter and receiver optical sub-assemblies extend through the openings of the EMI shield; and
wherein the optical transceiver further comprises a housing in which the optical transceiver is slidably positionable such that the electrically-conductive resiliently compressible material is compressed between the optical transceiver and the housing, whereby compression and resilience of the electrically-conductive resiliently compressible material helps effectively seal gap(s) between the EMI shield and the housing against EMI leakage and/or helps establish an electrically-conductive pathway between the sidewalls and the housing.

17. A method relating to electromagnetic interference (EMI) shielding for an optical transceiver including transmitter and receiver optical sub-assemblies, the method comprising:
providing an EMI shield with electrically-conductive resiliently compressible material along at least a portion of an outer perimeter defined by sidewalls of the EMI shield that depend from a portion of the EMI shield that includes openings configured for receiving the transmitter and receiver optical sub-assemblies of the optical transceiver therethrough to thereby allow the EMI shield to be fit over the transmitter and receiver optical sub-assemblies for installation along a portion of the optical transceiver;
positioning the EMI shield relative to the transmitter and receiver optical sub-assemblies of the optical transceiver such that the transmitter and receiver optical sub-assemblies extend through openings in a portion of the EMI shield and such that the EMI shield installed along a portion of the optical transceiver; and positioning the optical transceiver and the EMI shield within a housing such that the electrically-conductive resiliently compressible material is compressed between the sidewalls and the housing and establishes an electrically-conductive pathway between the sidewalls and the housing.

18. An electromagnetic interference (EMI) shield for a device including first and second portions, the EMI shield comprising:

a portion including first and second openings configured for respectively receiving the first and second portions of the device to thereby allow the EMI shield to be fit over the first and second portions of the device;

sidewalls depending from the portion that includes the openings; and electrically-conductive resiliently compressible material along at least a portion of an outer perimeter defined by the sidewalls;

wherein the electrically-conductive resiliently compressible material is configured to be compressible between the device and a housing when the EMI shield is installed on the device and positioned within the housing, for establishing an electrically-conductive pathway between the sidewalls and the housing and/or for sealing one or more gaps between the EMI shield and the housing against EMI leakage.

\* \* \* \* \*